Figure 1:
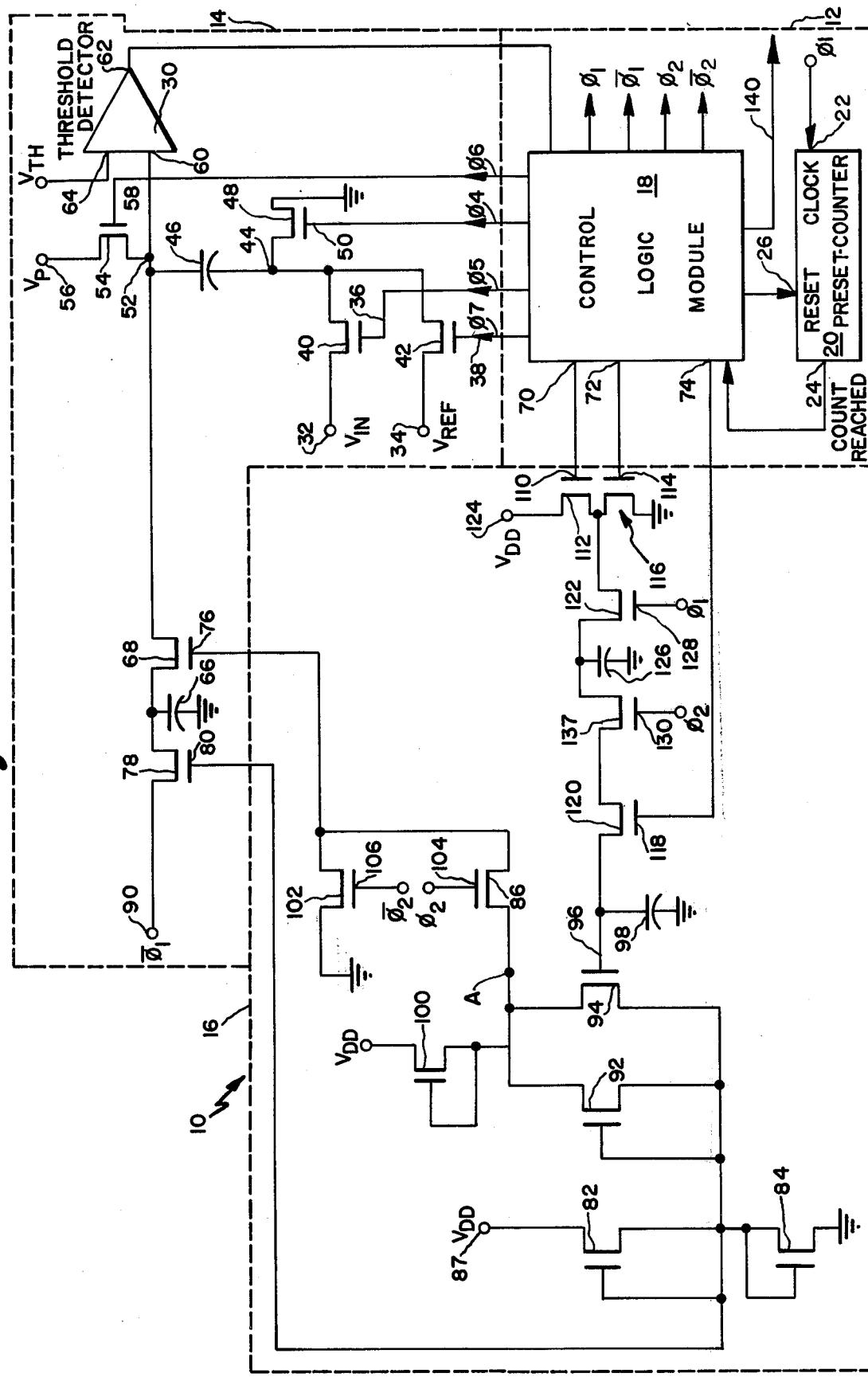

United States Patent [19]

Butler et al.

[11] 4,074,260

[45] Feb. 14, 1978

[54] ANALOG-TO-DIGITAL CONVERTER

[75] Inventors: Walter J. Butler, Scotia; Charles W. Eichelberger, Schenectady, both of N.Y.

[73] Assignee: General Electric Company, Schenectady, N.Y.

[21] Appl. No.: 689,456

[22] Filed: May 24, 1976

[51] Int. Cl.² .......................................... H03K 13/02
[52] U.S. Cl. ...................... 340/347 CC; 340/347 AD
[58] Field of Search ................ 340/347 AD, 347 NT, 340/347 RC

[56] References Cited

U.S. PATENT DOCUMENTS

| 2,897,486 | 7/1959 | Alexander | 340/347 CC |
| 3,296,613 | 1/1967 | Andersen | 340/347 AD |
| 3,475,748 | 10/1969 | Price | 340/347 CC |
| 3,688,305 | 8/1972 | Goldsworthy | 340/347 AD |

Primary Examiner—Charles D. Miller
Attorney, Agent, or Firm—Geoffrey H. Krauss; Joseph T. Cohen; Jerome C. Squillaro

[57] ABSTRACT

An analog-to-digital converter is described including scaling means for providing an output based on a preselected scale factor. Conversion is made by selectively transferring charge from a charge storage location in discrete quanta the size of which are adjusted during the course of conversion in order to eliminate certain sources of error including threshold drift, leakage and transistor gain drift.

10 Claims, 2 Drawing Figures

ANALOG-TO-DIGITAL CONVERTER

This invention relates in general to charge transfer analog-to-digital converters and more specifically to a charge transfer analog-to-digital converter including means for providing a preselected output scale factor.

Metered charge transfer analog-to-digital converters have been described, for example, in U.S. Pat. applications Ser. No. 628,401 of Eichelberger, Ser. No. 628,542 of Puckette and Butler and Ser. No. 668,329 of Butler and Eichelberger, each of which is assigned to the assignee of the instant application.

It is often times advantageous to provide scaled output readings from an analog-to-digital converter. In this way, outputs may be realized which are directly utilizable by means either of a display or as an input to an ancillary device. Transducers may be accommodated as input devices to an analog-to-digital converter in accordance with this invention which provide a wide range of output voltages as the function of the input parameters sensed. For example, a thermocouple might readily be utilized which provides an output voltage of 0-50 millivolts over a temperature range of 0° to 100° C, i.e. junction at 0° C. An analog-to-digital converter in accordance with this invention is uniquely able to convert the output range from voltage to degrees Centrigrade without the need for complex associated conversion circuitry. Further, analog-to-digital converters utilizing metered charge transfer techniques are often times susceptible to certain error sources including threshold drift, photon generated and thermally generated spurious change, leakage and transistor gain drift. It is desirable to eliminate the effects of these errors and provide an analog-to-digital converter having an output signal which depends only upon a reference voltage which may be readily maintained at a stable value.

It is an object, therefore, of this invention to provide means associated with an analog-to-digital converter of the metered or counting type which provides for scaling of the digital output of the converter in accordance with a preselected scale factor.

It is another object of this invention to provide means associated with a metered or counting analog-to-digital converter which continuously compensates for varying circuit parameters and provides a digital output which is continuously calibrated to a single reference.

It is a further object of this invention to provide scaling means associated with a metered charge transfer analog-to-digital converter, and compatible therewith both as to method of fabrication and of operation.

It is yet another object of this invention to provide a monolithic metered charge transfer analog-to-digital converter having a scaled output and including means for eliminating the effects of internally generated errors.

These and other objects and advantages are obtained in accordance with this invention by a metered charge counting analog-to-digital converter which includes means for varying the size of a plurality of charge packets which is accumulated in a charge storage location. The size of the charge packets is varied in accordance with an error signal developed during a reference period of a conversion cycle. An analog-to-digital converter in accordance with this invention is readily adaptable to be fabricated in monolithic integrated circuit form. In accordance with one aspect of this invention, a counter is utilized to preset the scale in which the output data will be presented. In accordance with another aspect of this invention the lowest or minimum count may be preset. Insofar as the invention includes a linear analog-to-digital converter, the presetting of the initial and final counts allows the output data to be presented in accordance with an arbitrarily selected scale factor.

Figure 2:
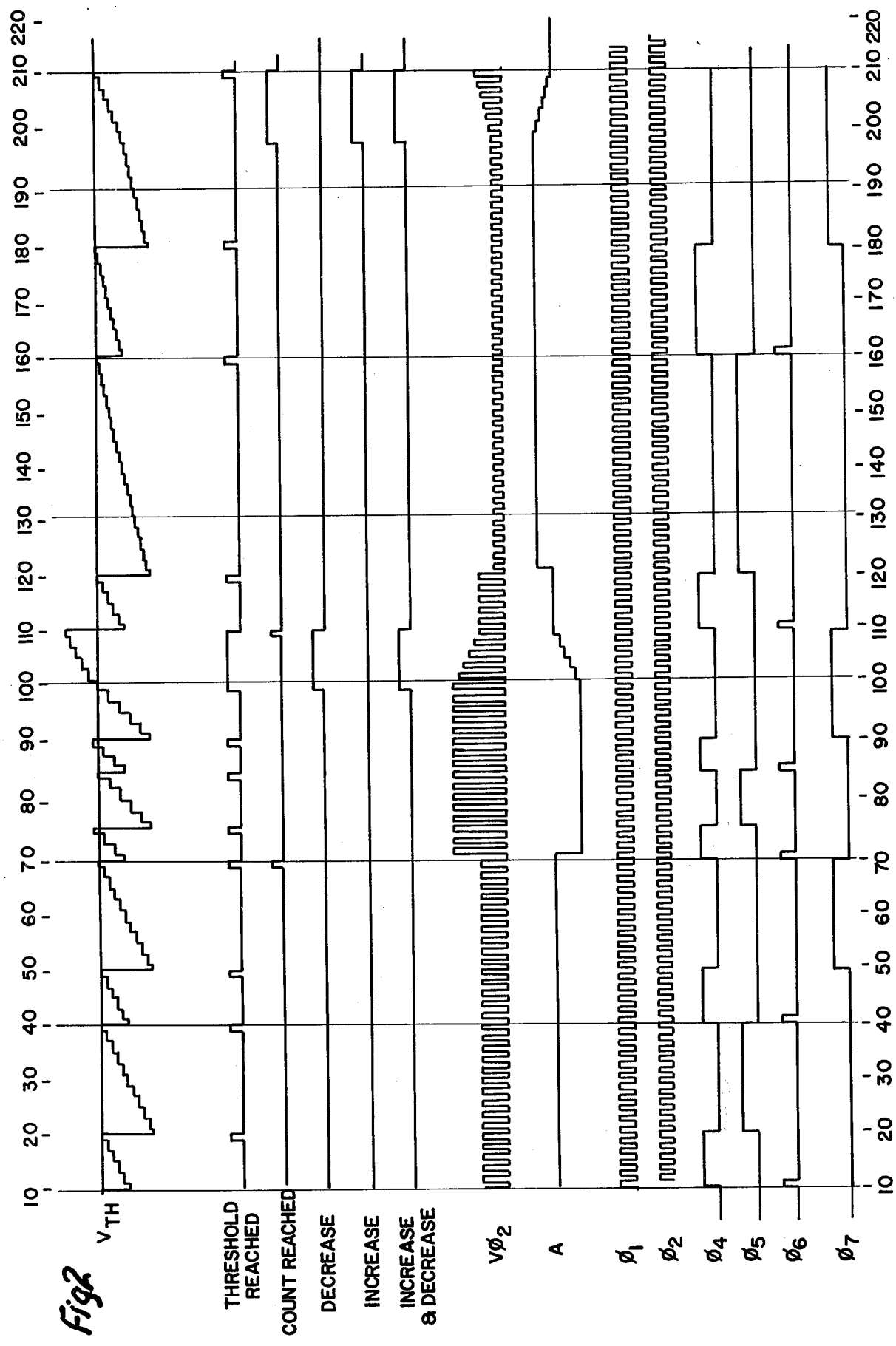

The features of the invention which are believed to be novel are pointed out with particularity in the appended claims. The invention itself, however, both as to its organization and method of operation together with further objects and advantages thereof may best be understood by reference to the following description taken in connection with the accompanying drawings in which:

FIG. 1 is a partial schematic, partial block diagram representaton of an anaog-to-digital converter including means for eliminating internally generated errors and further means for providing for output scaling; and FIG. 2 is a waveform diagram of certain of the signals appearing at varous points in the circuit of FIG. 1.

Referring specifically now to FIG. 1 wherein a presently preferred embodiment of a charge transfer analog-to-digital converter in accordance with this invention is illustrated in partial schematic, partial block diagram form, the converter itself is designated generally at 10. Converter 10 may be most readily understood in conjunction with the following description by considering three portions thereof, a control portion 12, a metering portion 14 and a scaling portion 16. Control portion 12 includes control logic module 18 and preset counter 20. Control logic module 18 includes clock means for generating the various driving signals applied to the sundry switching transistors which form a part of this invention and further means for generating particular control signals in response to input signals applied to control logic module 18. The actual structure of control logic module 18 is not described herein and those skilled in the art will readily appreciate that a wide variety of particular circuitry will readily produce the waveforms required at the outputs of control logic module 18 which waveforms are illustrated in FIG. 2. Similarly, no particular structure is illustrated for preset counter 20. Functionally, preset counter 20 is responsive to clock input 22 when a preselected number of counts have been accumulated. Preset counter 20 is also provided with reset input 26 which conditionalizes the count in response to a signal provided by control logic module 18. Control logic module 18 provides switching signals generally designated by $\phi_n$. Certain connections between the control logic module and the sundry switching transistors are illustrated while others are omitted for purposes of clarity. It will be understood that where the gates of certain of the switching transistors of analog-to-digital converter 10 are designated merely by $\phi_n$, that connection is appropriately made to the correspondingly designated output of control logic module 18. Similarly, no power supply is specifically illustrated in FIG. 1. Those skilled in the art will appreciate that an appropriate power supply must be provided which power supply will include voltages of selected magnitude and polarity to energize the various circuits described herein. For example, $V_{DD}$ may be a voltage source of approximately 20 volts, $V_P$ a source of 20 volts, $V_{TH}$ a source of 5 volts and the connections to ground will be understood to be either to an actual ground or a circuit ground which may be at an arbitrary voltage. Each of the transistor switches illustrated in FIG. 1 is, for purposes of this exemplary embodiment of the invention, a p-channel metal-oxide-semiconductor (MOS) transistor. It will be understood that while MOS transistors are preferred in accordance with this exemplary embodiment of the invention, that other switching transistors, as for example, junction field effect transistors or other types of switches may be readily employed, suitable modification being made to the control logic module voltages to accommodate the changes. The preferred embodiment of this invention illustrated in FIG. 1 utilizes MOS transistors and is therefore readily integrable in monolithic integrated circuit form. Accordingly, an analog-to-digital converter in accordance with this invention provides a converter which is readily adapted to be manufactured in extremely low cost form utilizing readily available technology. It will be appreciated by reference to FIG. 1 that with the exception of control logic module 18, preset counter 20 and threshold detector 30 that the only devices included in analog-to-digital converter 10 are MOS transistors and capacitors which may be readily fabricated in MOS form. As is well known, control logic module 18 which provides clock signals and logic signals only along with counter 20 may readily be implemented in MOS form by one skilled in the art. Similarly, as is well known, threshold detectors may likewise be implemented. It will be seen then that the entire structure of analog-to-digital converter 10 may be readily fabricated in a single monolithic integrated circuit.

In operation, an unknown voltage which it is desired to convert is connected to input terminal 32. A known reference voltage (which need not, however, be a particular value) is connected to terminal 34. Switching signals $\phi 5$ and $\phi 7$ are connected to gate terminals 36 and 38 of switching transistors 40 and 42, respectively. Transistors 40 and 42 provide selective connection of terminal 44 of capacitor 46 to one of terminals 32 or 34 during a measurement cycle. Switching transistor 48 selectively connects terminal 44 to ground when appropriately energized by switching signal $\phi 4$ connected to gate terminal 50 of transistor 48. Terminal 52 of capacitor 46 is connected through switching transistor 54 to terminal 56 which is adapted to be connected to a source of precharge voltage $V_P$. Gate terminal 58 of switching transistor 54 is connected to switching signal $\phi 6$ from control logic module 18. Terminal 52 of capacitor 46 is further connected to input 60 of threshold detector 30. Threshold detector 30 may conveniently be a Schmitt trigger type detector which provides an output signal at output 62 thereof whenever the signal applied to input 60 exceeds a threshold voltage, indicated herein as $V_{TH}$ applied to input 64 of detector 30. It will be understood that $V_{TH}$ may not, in all cases, represent an actual voltage source but rather conceptually indicates the threshold voltage of detector 30. It is a feature of this invention that the threshold voltage at which detector 30 provides an output signal at output terminal 62 thereof need not have exceptional long term stability since an analog-to-digital converter in accordance with this invention provides a self-calibrate or automatic zero function before each measurement. Accordingly, the threshold voltage of detector 30 need be stable only over the short term, for example for periods substantially less than one second. Terminal 52 is further connected to capacitor 66 through switching transistor 68. Capacitor 66 provides for the removal of charge packets of selected size from capacitor 46. The operation of scaling portion 16 of analog-to-digital converter 10 which adjusts the size of the charge packets removed from capacitor 46 will be discussed in detail hereinbelow.

Three distinct periods characterize the operation of an analog-to-digital converter in accordance with this invention. Reference to FIG. 2 along with the discussion to follow will provide a ready understanding of the operation of an analog-to-digital converter of the type described herein. An automatic zero setting, or "zero" period precedes each of a measurement period and a reference period which alternate during a conversion cycle. FIG. 2 illustrates the waveforms present in the analog-to-digital converter of FIG. 1 during three complete measurement cycles to illustrate the operation of converter 10 when the charge packets removed from capacitor 46 are at, above, and below their nominal value. It will be appreciated by reference to FIG. 2 that the order of periods during a conversion cycle is zero, measure, zero, reference, etc.

It will be appreciated that the waveforms of FIG. 2 assume that analog-to-digital converter 10 has completed any transient conditions associated with the start-up of the device and has, therefore, reached a steady-state operating condition. It will be further appreciated that the waveforms of FIG. 2 depict conditions occurring during an on-going sequence of conversions. Still further, an arbitrary time scale is provided which time scale is derived from logic signals $\phi 1$ and $\phi 2$ which are the basic timing signals of the device. Each half cycle of either $\phi 1$ or $\phi 2$ is a unit of time. In order to emphasize that the waveforms of FIG. 2 do not reflect start-up conditions, the earliest time for which any waveform is indicated is at approximately $t=10$. The actual rate at which operations occur in an analog-to-digital converter in accordance with this invention is somewhat arbitrary and depends upon the devices selected. It may often times be advantageous to provide a frequency for waveforms $\phi 1$ and $\phi 2$ in the range of 10 Kilohertz to 10 Megahertz. It is emphasized that an analog-to-digital converter in accordance with this invention is not time dependent and, in fact, it is not required that the frequency of $\phi 1$ and/or $\phi 2$ to be maintained at a constant value but rather that the relationships between the various waveforms depicted in FIG. 2 be maintained. An analog-to-digital converter in accordance with this invention is a counting analog-to-digital converter rather than a time-integrating or other type. The waveforms of FIG. 2 illustrate respectively: the voltage at terminal 52 of capacitor 46 which is the voltage applied to threshold detector 30; the "threshold" reached signal which is the output signal appearing at output terminal 62 of threshold detector 30; a "count reached" signal which is the signal appearing at output 24 of preset counter 20; a "decrease" signal which is the signal appearing at output 70 of control and logic module 18; an "increase" signal which is the signal appearing at output 72 of control and logic module 18; an "increase or decrease" signal which is a signal appearing at output 74 of control and logic module 18; $V\phi_2$ which is the voltage applied to gate terminal 76 of switching transistor 68; "A" which is the voltage appearing at node A; and $\phi 1$, $\phi 2$, $\phi 4$, $\phi 5$, $\phi 6$ and $\phi 7$ which are the signals appearing at the like identified outputs of control and logic module 18. Not illustrated are the complements of waveforms $\phi 1$ and $\phi 2$, i.e. $\overline{\phi 1}$ and $\overline{\phi 2}$, which are provided by control logic module 18. It will be understood that $\phi 2$ may be the complement of $\phi 1$ and that $\phi 1$ may be the complement of $\phi 2$ and that these designations are included for the purpose of more easily understanding the invention.

Those skilled in the art will appreciate that where a waveform is utilized to energize more than one device that suitable isolation may be required or that multiple outputs may be provided from control logic module 18.

The first portion of the conversion cycle illustrated in FIG. 2 depicts a cycle wherein it is assumed that the charge packets removed from capacitor 46 have equilibrated at the desired size and that no correction is therefore required. This period extends from approximately time 10 to time 70. Referring now particularly to time 10, a zero cycle begins. Just before time 10, the voltage at node 52 is at the threshold voltage and at time 10 it decreases to a more negative value as $\phi 4$ turns on transistor switch 48 and connects terminal 44 of capacitor 46 to ground. Similarly, $\phi 6$ turns on semiconductor switch 52 connecting terminal 52 to prechange voltage source $V_P$. At time 11, $\phi 6$ turns off thereby turning off transistor switch 54 and charge packets are commenced to be removed from capacitor 46 by the cooperative interaction of transistor switch 68, capacitor 66 and transistor switch 78. The magnitude of the charge packets removed from capacitor 46 depends upon the difference in voltage applied to gates 76 and 80 of transistor switches 68 and 78, respectively. Gate 80 of transistor 78 is connected to a voltage source including transistors 82 and 84, the operation of which will be more fully discussed hereinbelow. Gate 76 is connected to node A through transistor switch 86. The voltage applied to gate 76 is $V\phi_2$ and is illustrated at FIG. 2. Since the voltage applied to gate 80 is substantially constant the difference in voltage applied to gates 76 and 80 is dependent only upon $V\phi_2$. It will be seen by reference to FIG. 2 that $V\phi_2$ is a constant clocked voltage during the period of interest. Charge is removed in substantially equal sized packets during the period from $t=10$ to $t=20$ at which time the threshold voltage of threshold detector 30 is reached and the zero portion of the cycle is terminated. At the time the threshold is reached, a threshold reached signal illustrated at FIG. 2, is applied to control logic module 18 from output 62 of detector 30.

At time 20 in response to the threshold reached signal, $\phi 4$ and $\phi 5$ change condition, $\phi 4$ turning transistor switch 48 off while $\phi 5$ turns transistor switch 40 on by the application of appropriate signals to gates 50 and 36, respectively. Terminal 44 of capacitor 46 is connected to input terminal 32 which, in turn, is connected to the input signal of the converter. All other conditions remain the same and a plurality of charge packets is transferred out of terminal 52 of capacitor 46 by the cooperative interacton of transistor switch 68, transistor switch 78, capacitor 66 and the associated circuitry. The number of charge packets required to be transferred from capacitor 46 in order to again reach the threshold voltage of detector 30 depends upon the magnitude of the input voltage applied. Referring to the graph of the voltage at node 52 it will be appreciated that the decrease in voltage from the threshold voltage which occurs at node 52 corresponds to the change in voltage at node 44 which is equal to the difference between the input voltage and ground or the absolute magnitude of the input voltage. Since the charge packets removed from capacitor 46 are of substantially equal size, the number of packets which must be removed in order to reachieve the threshold voltage at terminal 52 of capacitor 46 as detected by threshold detector 30, is a linear measure of the magnitude of the input voltage. The actual number of charge packets removed from capacitor 46 during the measurement period is a function of the size of the charge packets, and as will be recalled, it is assumed that during the measurement period from time 20 to time 40 that the charge packets have equilibrated at a nominal size such that the number of packets removed is equal to the magnitude of the applied voltage according to the preselected scale factor desired. For example, where it is desired to measure a voltage which lies between zero and one volt to an accuracy of one part in 1000, 1000 charge packets are desired to be removed to raise voltage at node 52 to the threshold voltage when one volt is applied to terminal 44. Although not specifically illustrated in FIG. 1, control logic module 18 may include means for counting the number of charge packets removed from capacitor 46 during a measurement portion of a conversion cycle. It will be appreciated that, as shown, analog-to-digital converter 10 includes all the required inputs to provide such a count. Either $\phi 1$ or $\phi 2$ signal waveforms provide a clock type signal which can be used to indicate the number of charge packets being removed from the capacitor. It will be seen by reference to FIG. 2 that during each full cycle of either $\phi 1$ or $\phi 2$ a single charge packet is removed. $\phi 5$ is low at all times except during the measurement portion of a conversion cycle. The measurement portion of a conversion cycle is terminated by the application of a threshold reached signal from output 62 of detector 32 to control logic module 18. This signal causes a change in state of $\phi 5$ and; $\phi 4$, which initiates a zero portion of the cycle; and $\phi 6$, which connects capacitor 46 to the source of precharge voltage.

From time 40 to time 50, a second zero portion of the conversion cycle occurs which is identical in all respects to the zero portion of the conversion cycle occurring between times 10 and 20. At time 50, a reference portion of the cycle commences with the attainment of the threshold voltage level as indicated by the threshold reached signal at the output of detector 30. When this threshold signal is applied to control logic module 18, $\phi 4$ changes to a low state turning off transistor switch 48, $\phi 5$ remains at a low state and $\phi 7$ switches to a high state turning on transistor switch 42 and connecting terminal 44 of capacitor 46 to reference voltage input 34. The voltage at node 52 changes from threshold voltage to the reference voltage and charge transfer from capacitor 46 commences in charge packets the same size as those which were transferred during the previous zero, measure and zero periods, respectively. During the reference period which extends from time 50 to time 70, clock pulses are applied to preset counter 20 which registers one count for each charge packet removed from capacitor 46. Present counter 20 provides a signal at count reached output 24 thereof when the number of clock pulses applied to input 22 equals the preset count entered into counter 20. So long as the preset count is reached at the same time as the threshold voltage is reached, the size of the charge packets removed is held constant. Note especially that the decrease, increase, and "increase or decrease" signals from control logic module 18 remain at zero throughout the reference period. At time 70, a perturbation is assumed to occur which instantaneously changes the voltage at node A as indicated at FIG. 2. It is emphasized that this type of abrupt perturbation is extremely unlikely to occur during a measurement cycle and is illustrated herein for purposes of describing the corrective reaction of the analog-to-digital converter of FIG. 1 to such a perturbation. More likely, a gradual change in charge packet size would be caused by a change in temperature or other parameter of the device. The corrective action remaining the same, however, and an abrupt perturbation effectively illustrates it. In order to fully understand the effects of such a perturbation, it is necessary to examine in some detail the scaling portion 16 of converter 10. Transistors 82 and 84 are connected as a voltage source, transistor 82 being connected as a current source and transistor 84 as a resistor. A source of voltage $V_{DD}$ 87 is connected to transistor 82 which provides a constant current flowing through transistor 84 to ground. The exact magnitude of the voltage produced at the junction of transistors 82 and 84 which is applied to terminal 80 of transistor 78 is arbitrary except that it is preferable in accordance with this invention that the voltage be sufficient to insure that transistor 78 remains ON for all voltages present at capacitor 66 during the operation of this invention. It is understood, of course, that transistor 78 will be turned off by the application of an appropriate waveform to terminal 90 which waveform is $\overline{\phi_1}$. The junction of transistors 82 and 84 is also connected to transistors 92 and 94. Transistor 92 is connected as a resistor as is transistor 94. Transistor 92 is connected in a fixed resistor configuration and transistor 94 is operated in its active region the resistance of transistor 94 being dependent upon the magnitude of the signal applied to gate terminal 96 thereof which is the voltage across capacitor 98 which is adjusted as will be hereinbelow described. Node A, at the junction of transistor 92, 94 and 100 is connected through transistor 86 to gate terminal 76 of transistor 68 and provides the signal which determines the difference in voltage applied between gates 80 and 76 as was hereinabove described. Transistor 100 is further connected as a current source and it will be appreciated that the voltage at node A is proportional to the resistance of transistor 94. It is desirable in accordance with this invention that capacitor 98 be fabricated in such a way as to minimize the leakage thereof in order to insure, to the extent possible, that the voltage applied to gate 96 of transistor 94 is maintained at as stable a value as possible. It will be appreciated, that in accordance with this invention, the voltage at node A will be maintained at a somewhat more stable value than the voltage at gate 96 insofar as a relatively large change in the voltage appearing across capacitor 98 will produce a somewhat smaller change in the voltage at node A. Referring again to FIG. 2, it will be appreciated that $V\phi_2$ is created by alternately energizing transistors 86 and 102 through the application of appropriate switching signals to gates 104 and 106 thereof, respectively, which connect gate 76 of transistor 68 alternately to node A and to ground. Switching signals $\phi_2$ and $\overline{\phi_2}$ may advantageously be generated in such a way as to insure that there is no time during which both transistors 86 and 102 are simultaneously energized. This will insure that the voltage at node A will be as stable as possible, and will change only in response to a change in the voltage across capacitor 98.

Control and logic module 18 provides three signals which control the adjustment of $V\phi_2$. These signals appear at outputs 70, 72 and 74 in pairs, either decrease and increase-or-decrease; or increase and increase-or-decrease. The decrease signal appearing at output 70 of control logic module 18 is connected to gate 110 of transistor 112; the increase signal appearing at output 72 of control logic module 18 is connected to gate 114 of transistor 116 and the increase or decrease signal appearing at output 74 is connected to gate terminal 118 of transistor 120. Transistor 120 is preferably constructed in accordance with this invention in order to provide the minimum possible losses due to leakage associated with the transistor. Accordingly, it may be advantageous to provide a guard ring or similar isolating structure surrounding transistor 120 in order to minimize the leakage thereto. It will be appreciated that when transistor 120 is off, capacitor 98 is substantially isolated and the voltage stored therein remains constant. While an analog-to-digital converter in accordance with this invention provides for stable and accurate operation even with less than ideal components, it is nevertheless desirable to provide components having characteristics which are well suited to the applications therefore. Transistors 112 and 116 selectively connect transistor 122 either to a source of voltage $V_{DD}$ connected to terminal 124 or to ground through transistors 112 and 116, respectively. Transistor 122 connects capacitor 126 either to $V_{DD}$ or ground whenever gate 128 is energized. Preferably, capacitor 126 is substantially smaller than capacitor 98, with a ratio of capacitances of 1000:1 being typical although not in anyway limiting. The ratio of capacitances will determine the size of the steps by which $V\phi_2$ is changed in order to accomplish the scaling aspect of this invention. Clearly, small steps are desirable insofar as they do not unduly limit the speed of the scaling or correcting operation. The operation of the increase and decrease functions may be most readily understood by considering an exemplary condition wherein a decrease signal is supplied at output 70 and consequently an increase-or-decrease signal is present at output 74 of control logic module 18. Gate 110 of transistor 112 is energized and transistor 122 is supplied with voltage $V_{DD}$ at one terminal thereof. As signals $\phi 1$ and $\phi 2$ which are applied to gates 128 and 130 of transistors 122 and 132, respectively, are alternately energized, charge is first supplied to capacitor 126 and then, as transistor 122 turns off and transistor 132 turns on through transistor 120 to capacitor 98. The toggling of $\phi 1$ and $\phi 2$ continues to supply charge packets to capacitor 98 so long as increase-or-decrease signals are applied to gate 118 of transistor 120. It will be understood, that in accordance with this invention, increase and decrease refer to the change in voltage which is created at node A and does not necessarily indicate any particular direction of change. For example, in accordance with the specific embodiment of this invention illustrated at FIG. 10, when a decrease signal is provided charge is transferred into capacitor 98 and when an increase signal is provided, charge is transferred out of capacitor 98. Those skilled in the art will recognize that the reverse may be utilized with suitable changes in the remaining circuitry.

Referring again to FIG. 2 and especially to the cycle beginning at time 70 thereof, the response of analog-to-digital converter 10 to the perturbation occuring at time 70 may now be readily appreciated. Zero, measure and zero periods occur in substantially the manner described hereinabove in conjunction with the period from time 10 to time 50. It will be appreciated that the step size during the period from time 70 to time 90 is substantially increased over that from time 10 to time 50 and therefore that the actual number of cycles required to reach the threshold level in each instance is reduced. This is due to the increase in level of $V\phi_2$ due to the increase in voltage at node A which in turn is due to the increase in voltage across capacitor 98. At approximately time 90, a second reference period begins. Control logic module 18 supplies a reset signal to reset input 26 of preset counter 20 and counts begin to accumulate as charge packets are transferred from capacitor 46 in the same manner as hereinabove described during the first reference period. At time 101, the threshold level of threshold detector 30 is reached and a signal is supplied at output 62 thereof. Note that this signal is reached before the count reaches the preset value. Specifically, it will be observed that 10 counts in this exemplary embodiment of this invention is the value which the preset counter responds to. At time 101, only five counts have occurred and therefore when the threshold reached signal is received by control logic module 18, the count reached signal has not yet occurred and accordingly and in response thereto, a decrease signal is supplied at output 70 in conjunction with an "increase or decrease" signal at output 74 of control logic module 18. As was hereinabove described, as long as a decrease signal is present, charge is transferred to capacitor 98 and accordingly the resistance of transistor 94 is decreased thus decreasing the voltage at node A and consequently the amplitude of $V\phi_2$. Between times 101 and 110, it will be seen that $V\phi_2$ decreases towards the nominal value which existed before the perturbation. At time 110, ten counts having occurred, a count reached signal is supplied by preset counter 20 to control logic module 18 and the reference period is terminated. It will be appreciated that while FIG. 2 and especially that portion between time 92 and time 110 illustrates a substantially complete correction of the perturbation in voltage at node A being effectuated in a single reference cycle, that this need not occur and, in fact, it may often times be desirable in accordance with this invention to effect a correction in more than one cycle so that a high degree of precision may be achieved. An analog-to-digital converter in accordance with this invention continuously performs measurement, zero and reference cycles and, once a nominal charge packet size has been achieved, maintains this nominal size through substantially smaller corrections than those illustrated in the figure.

That portion of the figure beginning at time 122 illustrates the corrective action of an analog-to-digital converter in accordance with this invention following the perturbation resulting in charge packets which are relatively too small compared to those in the additional period discussed hereinabove. The perturbation occurs at time 122 and results in a step-wise change in the value of the voltage at node A. The measurement cycle occurs substantially as hereinabove described except that insofar as the charge packets are too small relative to the reference voltage, the number of steps required to achieve the threshold voltage level is more than would otherwise be required and an erroneous count and therefore output is achieved. Similarly, during a zero period following the measurement period additional counts are required although, since the zero period essentially establishes the zero voltage, no output is provided in response thereto and the number of counts required during the zero period is immaterial. During the reference period and beginning at time 180, the reference voltages applied to the input as hereinabove described and charge packets are begun to be transferred. At time 201 as the tenth charge packet is transferred, the preset counter provides an output at output 24 thereof to control logic module 18. Since the threshold voltage has not been reached and since it is required to achieve both the threshold voltage and the preset count in order to terminate a reference period, it would be appreciated that charge is continuously transferred from capacitor 46 during the reference period until at time 210 the threshold voltage is achieved and a signal is provided from output 62 of threshold detector 30 which terminates the reference period. From time 201 to time 210 in response to the presence of a count reached signal and the absence of a threshold reached signal control logic module 18 provides both "increase" and "increase or decrease" signals to scaling module 16. As was hereinabove described during the period when "increase" and "increase or decrease" signals are applied to transistors 116 and 118, charge packets are removed from capacitor 98 reducing the voltage at gate terminal 96 of transistor 94 increasing the resistance thereof and increasing the voltage at node A. By reference now to FIG. 2, it will be seen that during the period from time 201 to 210, the voltage at node A, in fact, decreases and $V\phi_2$ increases to remove larger charge packets from capacitor 46 during the remainder of the reference period. The corrective action takes place during the reference period and it will be seen that the charge packets, as indicated by the size of the steps of voltage at node 52 actually increase and at time 210 have reached the nominal value.

In addition to providing for the automatic correction of changes in the size of charge packets transferred during a measurement cycle, an analog-to-digital converter in accordance with this invention provides the capability for scaling the output digital signal in accordance with a preselected scaling factor. Converter 10 provides an output signal at output port 140 which is a signal providing one pulse per step during the measurement portion of the cycle. It may be convenient to provide, within control logic module 18, means for converting this string of pulses (the number of which is a measure of the magnitude of input signal) to a more convenient form, as for example, a serial or parallel binary digit through the use of a counter as is well known to those skilled in the art. By providing a counter which begins counting at a number other than zero and by appropriately adjusting preset counter 20, it is possible to provide in accordance with this invention, a signal which is adapted to provide an output indication of an input analog signal in accordance with any desired scale factor. It is, of course, required in accordance with this invention as presently conceived, that the scale factor be a linear scale factor. By way of example, assume as was hereinabove described that a transducer is available which produces an output voltage which changes from zero volts to $\frac{1}{2}$ volt over a temperature range from zero to 100° C. Assume further that a reference voltage source is available of 0.75 volts, and that the threshold voltage is zero volts. In accordance with this invention, preset counter 20 is adjusted to a preset count of 150. During the reference portion of the cycle, the scaling module will adjust the size of the charge packets removed from capacitor 46 until 150 packets are required to change the voltage at node 52 from 0.75 volts to zero volts. Accordingly, 100 counts will be required to change from 0.5 volts to zero and a linear output will be produced which changes from zero to 100 counts over the range of from zero to 0.5 volts as required. The relationship between the full scale count, the full scale voltage, the preset count and the reference voltage is expressed as $$\frac{\text{Desired Full Scale Count}}{\text{Full Scale Voltage}} = \frac{\text{Preset Count}}{\text{Reference Voltage}}$$

It will be apparent to those skilled in the art that the lowest count need not be zero and that, for example, an indication might be produced which has a negative number for its lowest value.

While an embodiment of this invention has been illustrated which provides a reference period following each measurement period, it may be advantageous to provide less frequent reference periods in order to increase conversion speed. Depending upon the manner of fabrication of the device and hence its stability, relatively infrequent reference periods may be utilized without substantially decreasing performance. When speed of conversion is not a factor, the use of alternating reference and measurement periods provides exceptional performance.

An analog-to-digital converter in accordance with this invention provides, for the first time, means for both the automatic elimination of errors generated by the change in size of charge packets from whatever source and also the ability to scale the output reading to any desired value. Further, automatic zero setting and continuous self-adjustment are features. While the invention has been particulary shown and described with reference to several preferred embodiments thereof, it will be understood by those skilled in the art that vairous changes in form and detail may be made therein without departing from the true spirit and scope of the invention as defined by the appended claims.

What is claimed is:

1. In a non-integrating, time-independent linear counting analog-to-digital converter of the type wherein an analog signal is coupled to a first terminal of a two-terminal charge storage means and having means coupled to a second terminal of said charge storage means for the metered transfer of a plurality of charge packets into and out of said charge storage means with a charge packet magnitude determined by the difference in magnitude between first and second voltages, and threshold means coupled to said second terminal of said storage means for providing an output signal when a threshold level is reached, the improvement comprising:
   a reference voltage source;
   switch means for connecting the first terminal of said storage means selectively to said analog signal and to said reference voltage source;
   means enabled only when said reference voltage source is connected to said first terminal for counting the number of charge packets transferred to said storage means;
   means connected to said counting means for providing a signal when a preset count is reached in said counting means; and
   means responsive to said signal and to said output signal for adjusting the magnitude of at least one of said first and second voltages to vary the amount of charge in each of said plurality of charge packets to cause said preset count to be reached simultaneously with said output signal.

2. The analog-to-digital converter of claim 1 wherein said means responsive to said output signal comprises means for increasing the magnitude of said charge packets when said preset count is reached before said threshold level and for decreasing said magnitude of said charge packets when said threshold level is reached before said preset count.

3. The analog-to-digital converter of claim 2 wherein the magnitude of said charge packets are increased or decreased during an interval between said threshold being reached and said count being reached.

4. The analog-to-digital converter of claim 3 wherein each charge packet is transferred during one of a multiplicity of clock periods, and the magnitude of each of said charge packets is increased or decreased in substantial synchronization with said metered transfer of that charge packet.

5. The analog-to-digital converter of claim 4 wherein said charge packets are increased or decreased by a preselected amount during each clock period between said threshold being reached and said count being reached.

6. The analog-to-digital converter of claim 5 wherein said means for adjusting said magnitude includes first means for providing a substantially constant voltage for one of said first and second voltages; second means for storing a signal proportional to said magnitude; and third means for providing the remaining one of said first and second voltages in inverse relationship to said stored signal.

7. The analog-to-digital converter of claim 6 wherein said second means comprises capacitor means.

8. The analog-to-digital converter of claim 7 further including means for substantially isolating said capacitor means when said preset count and said threshold signal are reached simultaneously.

9. The analog-to-digital converter of claim 8 further including means for isolating said capacitor means except when said switch means connects said converter to said reference voltage source.

10. The analog-to-digital converter of claim 7, wherein said third means comprises means coupled to said first means for providing an electrical resistance having aamagnitude which is a function of the magnitude of said stored signal; and means for providing a substantially constant flow of current through said resistance means towards said first means for generating said remaining one of said voltages.

* * * * *